(12) United States Patent
Snyman

(10) Patent No.: US 8,718,480 B2
(45) Date of Patent: May 6, 2014

(54) ALL SILICON 750NM AND CMOS-BASED OPTICAL COMMUNICATION SYSTEM UTILIZING MOD-E AVALANCHE LEDS

(75) Inventor: Lukas Willem Snyman, Faerie Glen (ZA)

(73) Assignee: Tshwane University of Technology, Pretoria West, Pretoria (ZA)

( * ) Notice: Subject to any disclaimer, the term of this patent is extended or adjusted under 35 U.S.C. 154(b) by 19 days.

(21) Appl. No.: 13/378,215

(22) PCT Filed: Jun. 15, 2010

(86) PCT No.: PCT/ZA2010/000032
§ 371 (c)(1),
(2), (4) Date: Mar. 19, 2012

(87) PCT Pub. No.: WO2011/035348
PCT Pub. Date: Mar. 24, 2011

(65) Prior Publication Data
US 2012/0170942 A1 Jul. 5, 2012

(30) Foreign Application Priority Data

| Jun. 15, 2009 | (ZA) | ................................. | 2009/04162 |
| Jun. 15, 2009 | (ZA) | ................................. | 2009/04163 |
| Jun. 26, 2009 | (ZA) | ................................. | 2009/04508 |
| Jun. 26, 2009 | (ZA) | ................................. | 2009/04509 |
| Jul. 8, 2009 | (ZA) | ................................. | 2009/04787 |
| Dec. 11, 2009 | (ZA) | ................................. | 2009/08833 |
| Dec. 18, 2009 | (ZA) | ................................. | 2009/09015 |
| Jan. 12, 2010 | (ZA) | ................................. | 2010/00200 |
| Mar. 23, 2010 | (ZA) | ................................. | 2010/02021 |
| May 21, 2010 | (ZA) | ................................. | 2010/03603 |
| May 21, 2010 | (ZA) | ................................. | 2010/03605 |

(51) Int. Cl.
*H04B 10/00* (2013.01)
*H04B 10/80* (2013.01)
*H04B 10/40* (2013.01)

(52) U.S. Cl.
CPC ................................. *H04B 10/801* (2013.01);
*H04B 10/40* (2013.01)
USPC .......................................... 398/138; 398/164

(58) Field of Classification Search
USPC .................................. 398/138, 139, 164, 142
See application file for complete search history.

(56) References Cited

U.S. PATENT DOCUMENTS 6,821,802 B2 * 11/2004 Ahn et al. ........................ 438/27
7,846,814 B2 * 12/2010 Lee ................................ 438/455

(Continued)

FOREIGN PATENT DOCUMENTS

WO   WO 2009/047716 A1   4/2009

OTHER PUBLICATIONS

Snyman, L. et al. "Three Terminal n+ppn Silicon CMOS Light Emitting Devices (450nm-750nm) with Three Order Increase in Quantum Efficiency", IEEE ISIE, vol. 3, Jun. 20-23, 2005, pp. 1159-1166.

(Continued)

Primary Examiner — Dalzid Singh
(74) Attorney, Agent, or Firm — Merchant & Gould P.C.

(57) ABSTRACT

An optical communication system is provided comprising of a three terminal silicon based light emitting device operating by means of avalanche carrier multiplication and emitting at the below threshold wavelength detection range for Silicon of 850 nm; a low loss optical waveguide operating in the below threshold wavelength detection range for Silicon of 850 nm; and an optical detector, wherein a complete and all-silicon optical communication system is formed being capable of transferring electrical signals in terms of optical intensity variations, such intensities then being propagated through the waveguide and being detected by the optical detector; and being converted back to electrical signals. In a particular mode of operation of the system, wavelength modulation may be obtained. In other applications, transponding action and optical amplification may be obtained.

15 Claims, 16 Drawing Sheets

(56) References Cited

U.S. PATENT DOCUMENTS

| | | | |
|---|---|---|---|
| 7,989,822 B2 * | 8/2011 | Worley | 257/88 |
| 2006/0147214 A1 | 7/2006 | Ruiz et al. | |

OTHER PUBLICATIONS

Snyman, L. et al. "Increasing the efficiency of $p^+np^+$ injection-avalanche Si CMOS LED's (450nm-750nm) by means of depletion layer profiling and reach-through techniques", Proc. of SPIE, vol. 6898, Feb. 7, 2008, pp. 68980E-1-68980E-12.

Snyman, L. et al. "A Dependency of Quantum Efficiency of Silicon CMOS $n^+pp^+$ LEDs on Current Density", IEEE Photonics Technology Letters, vol. 17, No. 10, Oct. 2005, pp. 2041-2043.

Mavrogiannopoulou, E. et al. "Real-time detection of BRCA1 gene mutations using a monolithic silicon optocouple array", Biosensors and Bioelectronics, vol. 24, No. 5, Jan. 1, 2009, pp. 1341-1347.

Misiakos, K. et al. "Monolithic silicon optoelectronic devices for protein and DNA detection", Proceedings of SPIE, vol. 6125, No. 1, Jan. 25, 2006, pp. 6125W-1.

* cited by examiner a b a b

ALL SILICON 750NM AND CMOS-BASED OPTICAL COMMUNICATION SYSTEM UTILIZING MOD-E AVALANCHE LEDS

This application is a National Stage Application of PCT/ZA2010/000032, filed 15 Jun. 2010, which claims benefit of Serial No. 2009/04162, filed 15 Jun. 2009 in South Africa, Serial No. 2009/4163, filed 15 Jun. 2009 in South Africa, Serial No. 2009/04508, filed 26 Jun. 2009 in South Africa, Serial No. 2009/04509, filed 26 Jun. 2009 in South Africa, Serial No. 2009/04787, filed 8 Jul. 2009 in South Africa, Serial No. 2009/08833, filed 11 Dec. 2009 in South Africa, Serial No. 2009/09015, filed 18 Dec. 2009 in South Africa, Serial No. 2010/00200, filed 12 Jan. 2010 in South Africa, Serial No. 2010/02021, filed 23 Mar. 2010 in South Africa, Serial No. 2010/03603, filed 21 May 2010 in South Africa and Serial No. 2010/03605, filed 21 May 2010 in South Africa and which applications are incorporated herein by reference. To the extent appropriate, a claim of priority is made to each of the above disclosed applications.

INTRODUCTION

This invention relates to generally to the field of silicon light emitting devices (SiLEDs), and its application into current Complementary Metal Oxide Semiconductor (CMOS) technology, as well as into future Silicon on Insulator (SOI) technology.

BACKGROUND TO THE INVENTION

The vast majority of micro-electronic devices are formed in silicon. Over the last several decades, a substantial effort has been directed to refining the reliability and manufacturability of these devices. As a result, silicon-based microelectronic devices have become dependable and inexpensive commodity items. Particularly, Complementary Metal Oxide Semiconductor (CMOS) technology has become a multi-billion industry providing the basis manufacturing technology for nearly 90% of all electronic commodities to society. Furthermore, Silicon-on-Insulator (SOI) technology is regarded as a future basis technology for combining optoelectronics technology with mainstream electronics manufacturing technology.

It is to be assumed that the current state of the art focuses on 1100 nm and above 1100 nm optical communication systems for application in CMOS and SOI, mainly as a result of compatibility with long haul optical fibre communication networks. This approach has severe limitations since it requires the incorporation of Ge in the systems in order to realize efficient detectors, and or III-V technology using hybrid approaches in both material and processing procedures. These technologies are extremely complex and also very expensive.

To take advantage of the existing silicon-based knowledge and infrastructure, there is a great interest in integrating active optical components into CMOS and SOI silicon technologies.

Silicon, however, is an indirect band gap semiconductor material which, unlike a direct band gap semiconductor material, has low photon emission efficiency. As a result, silicon is considered a poor source of electroluminescent radiation.

Although the photon-generation mechanism is not well understood, one source of visible light from silicon is a reverse biased p-n junction under avalanche breakdown conditions. Avalanche breakdown occurs when the p-n junction is reverse-biased to the point of where the electric field across the junction accelerates electrons such that they have ionizing collisions with the lattice. The ionizing collisions generate additional electrons which, along with the original electrons, are accelerated into having additional ionizing collisions. As this process continues, the number of electrons increases dramatically in a very short period of time, producing a current multiplication effect. A small percentage of these collisions results in photonic emissions through intra-band carrier relaxation effects, and inter-band carrier recombination effects.

Building on this principle, Snyman, et al. in an article "A Dependency of Quantum Efficiency of Silicon CMOS n pp LEDs on Current Density, IEEE Photonics Technology Letters, Vol. 17, No. 10, October 2005, pp 2041-2043", have reported that the efficiency of light emission from silicon in such avalanching Silicon Light Emitting Device (Av Si LED) can be substantially increased by utilizing a reverse biased p-n junction with a wedge-shaped tip that confines the vertical and lateral electric field.

Several versions of optical waveguides have recently been realized using CMOS and SOI technology. These comprise either using an internal reflection mechanism or a rib wave-guided mechanism where optical modes are propagated laterally along the rib length. Some first iteration optoelectronic integrated circuits have been realized in CMOS technology utilizing CMOS processing technology, comprising of Si CMOS LED element, internal refection based waveguide using field oxide and SI N and dedicated detector elements using specially designed lateral incident detectors, all designed and processed in CMOS technology and designed by Snyman et al. Lately, Rowe et al. have realized more advanced and more efficient wave-guides in CMOS have been reported on using a rib design and mainly utilizing field oxide processing techniques in L. K. Rowe, M. Elsey, E, Post, N. Tarr, A. P. Knights, "A CMOS compatible rib waveguide with local oxidation of silicon isolation", Proc. SPIE 6477, 64770L, (2007). Some more advance simulation of waveguide propagation in CMOS over-layers has recently been reported upon as disclosed in the article by L. Snyman et al., "Application of Si LED's (450 nm-750 nm) in CMOS Integrated Circuitry based MOEMS—Simulation and Analysis", Proc. SPIE 7208, 72080C, (2009).

The utilization of Si nitride based over-layers as well Si Oxi Nitride based over-layers and coupling of light from Si LEDs as embedded in the Silicon substrates and CMOS wells into and out of these over-layers by means of special optoelectronic modules seems especially most viable, since it has recently been established that these materials are essentially transparent with low loss in dB per cm for above 650 nm radiation.

Accordingly, there is a need in the art to provide further improvements to both silicon based LED devices and wave guide technologies in the regime 650-850 nm.

OBJECTS OF THE INVENTION

It is an object of the present invention to provide a light emitting structure which offers a further improvement to known devices, and that is especially compatible with the 650-850 nm wavelength regime.

It is also an object of the present invention to provide a light emitting structure which is both novel and involves an inventive step.

SUMMARY OF THE INVENTION

According to a first aspect of the present invention, there is provided an optical communication system comprising of a silicon based light emitting device operating by means of avalanche carrier multiplication and emitting at the below threshold wavelength detection range for Silicon of 850 nm; a low loss optical waveguide operating in the below threshold wavelength detection range for Silicon of 850 nm; and an optical detector, wherein a complete and all-silicon optical communication system is formed being capable of transferring electrical signals in terms of optical intensity variations, such intensities then being propagated through the waveguide and being detected by the optical detector; and being converted back to electrical signals.

The Silicon Light emitting device may comprise a first body having a first region of high doping interfacing with a second region of lower doping and then interfacing with a third region of higher doping, such that transfer of carriers occurs from the first to the third region.

The Silicon Light emitting device may further comprise a third electrical metal terminal electrically contacting the second region such that the electric field profile in the lower doped second region is modified, so as to extract or inject additional carriers into or from the second region, and so as to enhance the light emission from the device.

The first body may interface with a second body such that effective transfer of optical radiation occurs from the first to the second body.

The second body may be the optical waveguide.

The second body may comprise an optical fibre.

The second body may comprise an environment outside the system.

Complementary Metal Oxide Semiconductor (CMOS) technology may be utilized.

Silicon on Insulator (SOI) technology may be utilized.

The optical communication system may further comprise special driving detector and signal processing circuitry.

The light emitting device may comprise a first body having a first region of high doping interfacing with a second region of lower doping and then interfacing with a region of higher doping, such that transfer of carriers occurs from the first to the third region.

An additional third electrical metal terminal may be electrically contacting the second region such that the electric field profile in the lower doped second region is modified, so as to extract or inject additional carriers into or from the second region, and so as to enhance the light emission from the device.

An additional third electrical metal terminal may be electrically contacting the second region such that the electric field profile in the lower doped second region is modified, so as to cause enhanced recombination of excited carriers with a high density of defect states as introduced into the second region or a region bounding the second region.

The first body may interface with a second body such that effective transfer of optical radiation occurs from the first to the second body.

The light emitting device may comprise a first body having a first region of high doping interfacing with a second region of lower doping and then interfacing with a region of higher doping, such that transfer of carriers occurs from the first to the third region so as extract or inject additional carriers into or from the second region, and so as to enhance the light emission from the device, so as to cause excited carriers to interact with a secondary material bounding or interfacing with the second region, or impregnated into the second region such that secondary photonic emission processes occur as a result of the interaction of the energetic carriers with the secondary material.

The first body may interface with a second body such that effective transfer of optical radiation occurs from the first to the second body.

The light emitting device may comprise a first body having a first region of high doping interfacing with a second region of lower doping and then interfacing with a region of higher doping, such that transfer of carriers occurs from the first to the third region and the metal contact terminal, so as extract or inject additional carriers into or from the second region, and so as to enhance the light emission from the device.

The first body may be embedded into the second body such that the electric field profile along the boundary of the first body and being modified and enhanced multiplication of excited carriers occurs and such that enhanced light emission occurs from the device.

The first body may be embedded into the second body such that a thin fourth region of very low doping level is introduced between the first and second region, so as to enhance the electric field profile between the first and second body and so as to enhance light emission from the device.

The above described embodiments of the invention then forms the primary basis for the design and invention of the current described all SOI or CMOS based optical communication system. A key feature derived from these embodiments are that low loss optical wave guiding can be achieved using standard CMOS materials and fabrication components at especially the longer wavelength regimes of 650-850 nm.

The above described embodiments of the invention allow for developing a so-called on-chip optical communication systems utilizing:

(1) below 850 nm wavelength (Si detector threshold) Si LED emitters (2) low loss optical waveguides utilizing standard CMOS materials and fabrication procedures, and (3) developing highly efficient opto-coupler structures in order to couple effectively from Si LED structures to waveguides and vice versa.

The above described embodiments of the invention have the potential to open up a whole new field of electro-optical applications such as opto-coupling, electrical-optical isolation between sub-sections on chip, optical clock pulsing on large CMOS chips, eliminating digital propagation delay effects between chip sub-sections, diverse data transfer systems by means of optical means on chip, data transfer from chip to the environments by means of optical fibre technology, diverse optical-based sensor systems and diverse Micro-Optical Mechanical Sensor (MOEMS) devices which offer a whole new range of sensing and monitoring on CMOS chips using optical means, making them "smarter", more efficient and more economical.

Si avalanche-based light emitting devices that can be integrated into CMOS integrated circuitry currently offer the following advantages.

Good electro-optical coupling and communication possibilities: The leakage currents at room temperature for small 10×10 micron detector are of the order of Pico Ampere and the low frequency floor power detection levels are in the order of pW's. The current power emission levels as emitted from Si CMOS LEDs are of the order of 10-100 nW's which is nearly three to four orders higher than the detectivity limits of these CMOS pn detectors. The multi-billion, economy of scale, CMOS technology and its small micro feature fabrication capabilities, therefore, offers diverse electro-optical applications utilizing this Si LED technology.

High potential bandwidth speed of operation greater than 1 Gb/sec: The small size In Av CMOS LED structures offers high modulation speeds because the main component of the device operate in reverse bias mode of operation, and the small dimensions of the device offers low intrinsic parasitic capacitances, enabling very high modulation speeds. The eventual speed of integrated Si LED optoelectronic components in CMOS integrated circuitry is determined by the surrounding driving and signal processing circuitry. Substantial progresses have been made in this regard leading to state of the art GHz signal processing speeds.

Good electrical isolation: Because of low leakage currents at room temperature, silicon CMOS technology offers very high electrical isolation between circuitry components.

Interference free detection and data processing: Optical detection and processing techniques are known to provide superior immunity to interference and noise. There is a massive trend to utilize optical techniques in microelectronics and commodity environment.

System reliability: Si avalanche diodes operate at high reliability levels in silicon technology and have a proven track record in this regard through utilization in especially power and Zener regulators.

In summary, an all silicon standard Complementary Metal-Oxide Semiconductor (CMOS) based optical communication system is described that utilize Modified Electrical Field Profile Avalanche Silicon Light Emitting Device (Si MOD-E AV LED), Silicon Modified E-Profile detection (Si MOD-E Detector) structure, Silicon oxi-nitride and trench-based optical (Si OXI-TRENCH) waveguide in the 650 nm-750 nm regime. The optical emission levels of the MOD-E Si LEDs are about three orders of magnitude higher than the low frequency detection level of the Si MOD-E detectors. The oxi-nitride trench-based waveguides offers a low loss of less than 0.1 dB per cm at 750 nm.

BRIEF DESCRIPTION OF THE DRAWINGS

The invention will now be described in greater detail by way of example with reference to the following drawings in which:

FIG. 7 (a) shows a source detector and biasing arrangement utilising shorter wavelength (450-650 nm) communications. FIG. 7 (b) shows a source detector and biasing arrangement utilising longer (650-850 nm) wavelength communication.

FIG. 9 represents a technology of filling up the trench with higher refractive index material after deposition of a suitable liner of lower refractive index material.

DETAILED DESCRIPTION OF THE INVENTION

Making now reference to the drawings, embodiments of the present invention are outlined in more detail.

Figure 1:
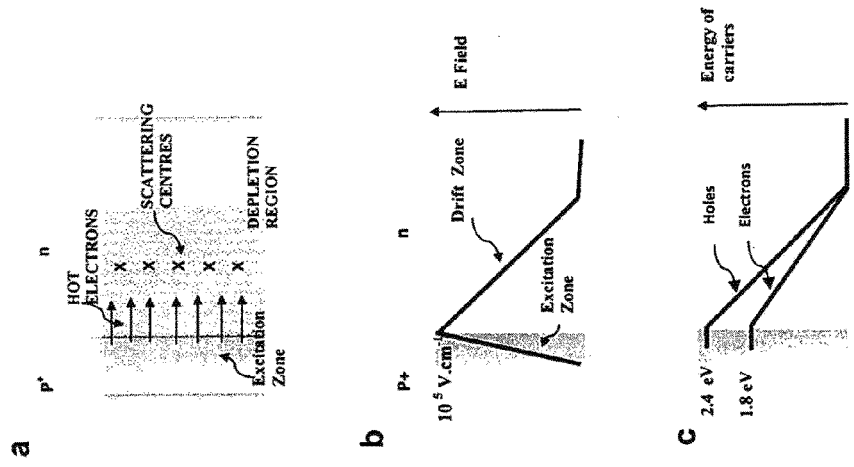
FIG. 1 shows schematic representations of the design concepts for a p$^+$np$^+$ injection-avalanche CMOS Si LED, with FIG. 1(a) depicting a structure of the device, FIG. 1(b) showing an electric field profile through the device and FIG. 1(c) showing possible photonic energy transitions for the device in the Si band diagram.

FIG. 1 illustrates Si Avalanche Light Emitting Diode (Si Av LED) technology. FIG. 1 (a) shows structure of a p+n Si Av LED showing the dimension of the depletion region, diffusion of hot electrons, and its possible interaction with scattering centres. FIG. 1 (b) shows the electric field profile through the device. FIG. 1 (c) shows the energy gained of the diffusing carriers as a function of distance through the device.

FIG. 1 illustrates some of the conceptual design aspects of a p$^+$n avalanche silicon LED technology, referring to specific device zones, electric field distribution, possible photonic transitions in the silicon energy band gap, and dynamic carrier densities during steady state operating conditions. Three clear activity regions of the device can be identified, that is a high field excitation zone generating hot carriers and a lower E-field drift zone.

The following provides more detail of the operation of the device may be described a follows. Upon biasing the device, a high linear increasing electric field is created at the one p$^+$n junction with its maximum at the p$^+$n interface. At some bias voltage, the E-field at the interface region attains high enough values such that charge multiplication (avalanche) processes occur in a narrow zone surrounding the interface. Energetic (excited) electrons are transferred towards the n-side of the junction and energetic (excited) holes are transferred towards the $p^+$ side of the junction.

Since the E-field decays linearly with distance away from the $p^+n$ interface, the transferred electrons soon reach regions where the E-filed is not high enough in order to sustain ionization and carrier multiplication processes, but they will still be transferred away from the junction in the linearly decreasing E-field. This region is referred to the depletion zone or drift zone of the device.

Figure 2:
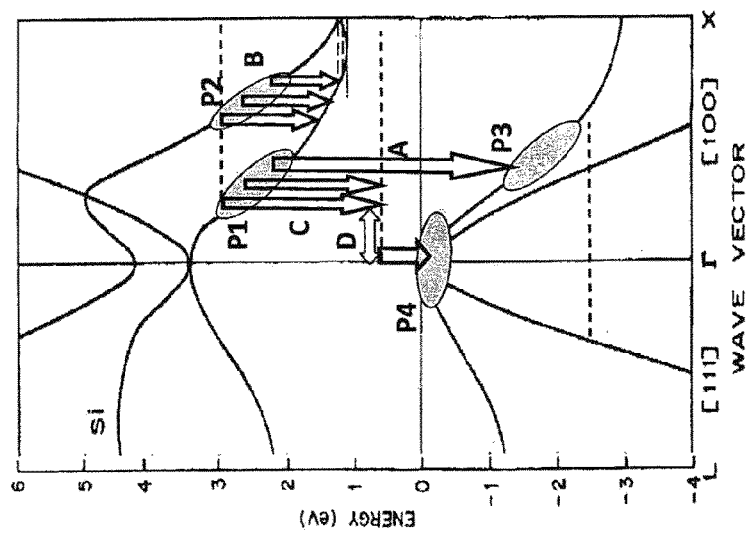
FIG. 2 shows possible photonic energy transitions for the device in the Si band diagram.

FIG. 2 demonstrates some of the major photonic transition processes that may be stimulated in the above scenario. FIG. 2 is an energy band diagram of silicon showing the possible relaxation of carriers as well as recombination of electrons and holes in silicon after excitation to higher energies.

Early investigations into the origin of light emission processes in avalanching np silicon junction, suggested that the main light production processes are related to host silicon atom ionization processes in the high field avalanching conditions, followed by subsequent intra-band relaxation processes and phonon assisted indirect band-to-band transitions.

However, some high energy inter-band optical transitions may be stimulated in the silicon band structure by utilizing the recombination behavior between excited carriers and lower energy carriers, and by utilizing some novel device designs.

In the following, a complete all-silicon optical communication system is described.

Figure 3A:
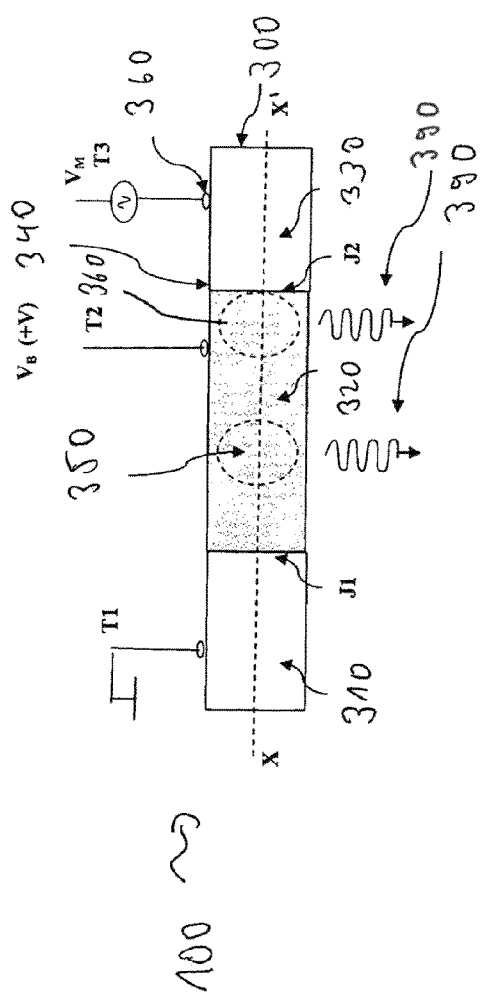
FIG. 3 (a) is a schematic presentation of the structure of the device; Fig (b) to (e) are corresponding parameter profiles as function of distance through the device. The respective region interfaces/junctions are shown as dotted lines.
Figure 3:
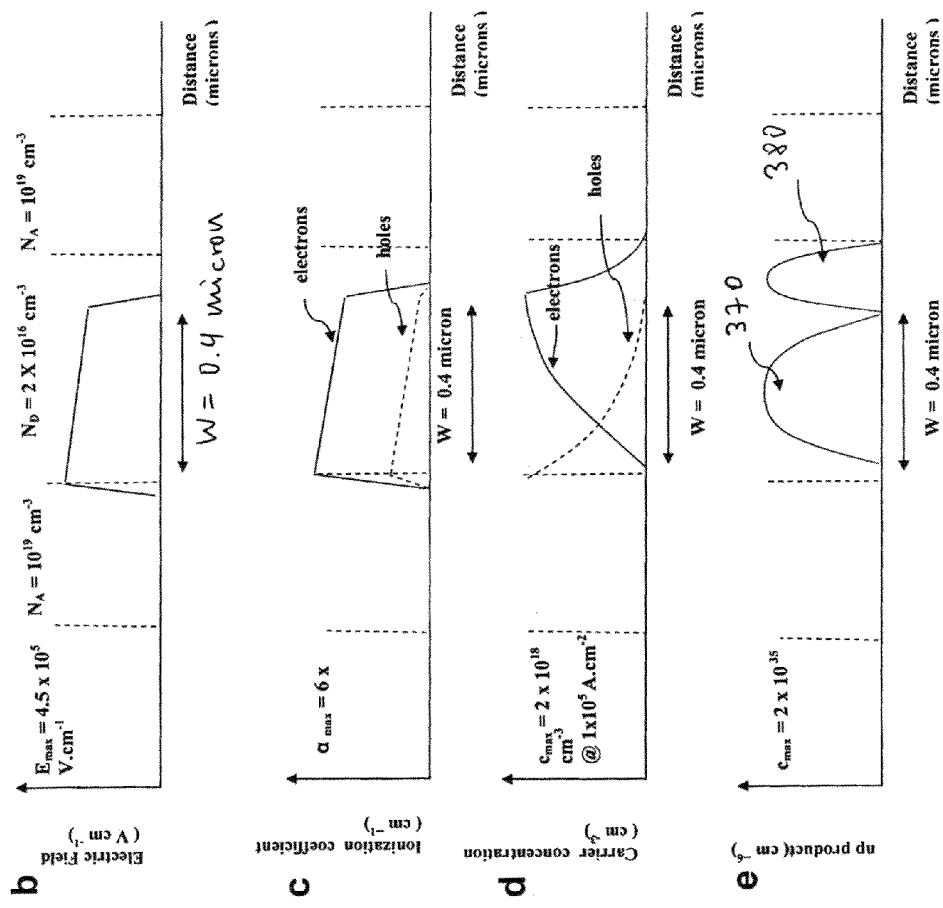

FIG. 3 ($a$) is a schematic presentation of the structure of the device in a top view. The basic active element of this system is a body 300. The body 300 is segmented in three regions, a first region 310, a second region 320 and a third region 330. The first region 310, the second region 320 and the third region 330 are arranged adjacent to each other and comprise different doping levels. The first region 310 is formed as a p+ structure, the second region 320 as an n structure and the third region 330 as either a n+ or p+ structure. Between the first region 310 and the second region 320, junction J1 is located, as indicated in FIG. 3 ($a$). Between the second region 320 and the third region 330, junction J2 is located. A top surface wall is schematically indicated by reference numeral 340. An electron-hole recombination zone 350 is formed within the second region 320.

FIG. 3 is schematic illustration of the layout in top view and voltage biasing that can be implemented in $n^+pp^+$ device in order to implement a modified (flat) E-field profile in the excitation part of the device and in order to create a high np recombination product in the device.

FIG. 3 ($c$), FIG. 3 ($d$) and FIG. 3 ($e$) are corresponding parameter profiles as function of distance through the device. The respective region interfaces/junctions are shown as dotted lines. The first region 310 is highly doped, appropriately contacted and to ground or some reference voltage. The second region 320 is of lower doping and of longer dimension, and interfaces with the third region 330 of higher doping, either of the same or opposite doping kind. A strategic metal feed and contact T2 is placed in the second region which directly contacts the latter part of the second region. Appropriate metal feeds T1 and T3 contact the first region 310 and third region 320 as well.

The first junction, J1, between the first region 310 and second region 320 is reverse biased so that a depletion region extends into the second region 320. This is achieved by placing an appropriate voltage on the metal feed T2 that contacts the second region 320. The depletion region extends far enough through the second region 320 that it touches the metal contact T2 region.

An electric field profile is set up though the second region 320 as is shown in FIG. 3 ($b$). This profile is a combination of the applied bias between the metal terminal T2 and semiconductor body 1, and the triangular electric field configuration as set up between the first region and the metal contact terminal T2. The metal terminal T2 and lowly doped region also sets up a low resistance contact path offering a low resistance biasing (or modulation) option to the E profile in the second region. The flatter E-Profile as obtained between the terminal T2 and the semiconductor body 1, enhances the ionisation of secondary carriers, enhances the total densities of excited carriers as obtained per unit volume in region 2 (320). Subsequently the photonic transition processes according to the recombination of energetic electrons and holes according to Type A (450-650 nm) in FIG. 2 can be enhanced in zone 350 of region 2. Since the mean diffusion length of the electrons (470) are longer than the decay of the electric field in region 2 surpassing the terminal 2 contact, photonic transitions of Type B (650-850 nm) as in FIG. 2 will be particularly stimulated in zone 360 of region 2 of the device. FIG. 3 ($c$) and ($d$) shows the ionization profiles for electron and holes through the device 100, and the resulting electron and hole density profiles through the device 100 with body 300 along the line XX' as indicated in FIG. 3 ($a$) when a p+nn+ configuration is used. FIG. 3 ($e$) shows the subsequent electron hole recombination and electron relaxation profiles 370 and 380, each generating a particular light generation zone 350 and 360 in the device, as schematically indicated by arrows 390. When a p+np+ configuration is used, injection of holes can occur from third region 330 into the second region 320 and results in recombination of the exciting energetic electrons with low energy injected holes in zone 380, resulting in transitions of Type C as in FIG. 2 and resulting in emission wavelengths 650-750 nm. Since both high densities of holes and electrons interact with each other, the emission intensity can be increased by orders of magnitude. j Correspondingly, electron relaxation type of light emission with a longer wavelength (750-850 nm) according to transitions of Type B in FIG. 2 can be realised with a p+nn+ configuration.

Correspondingly, electron recombination type of light emission with a longer wavelength (650-850 nm) according to transitions of Type B and C in FIG. 2 can be realised with a p+np+ configuration.

By varying the bias voltage on the contact T2 the region near the junction J1 can be placed in light emission mode through avalanche multiplication processes.

Figure 4:
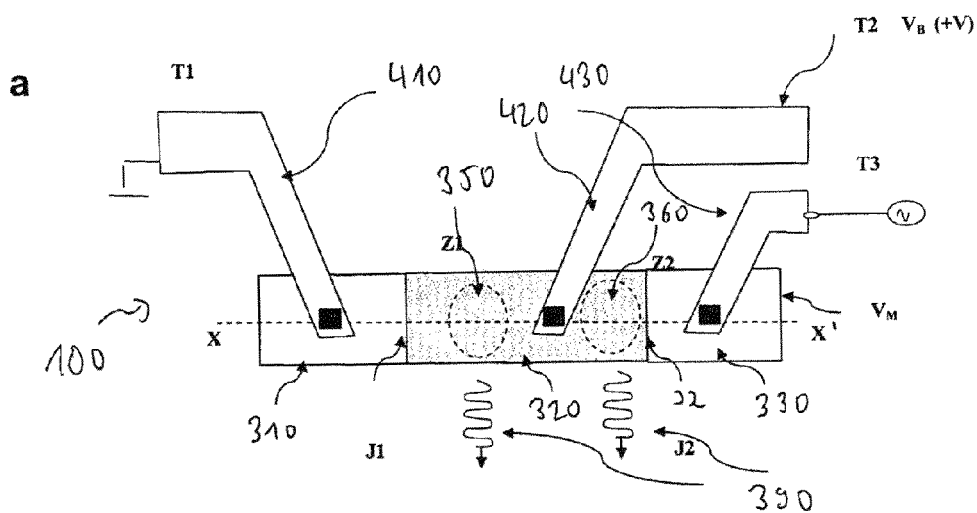
FIG. 4 is a schematic diagram showing (a) the structure of a E-MOD Si LED, the light emission zones, and (b), the electric field profiles through the device for various modes of operation of the device.
Figure 4:
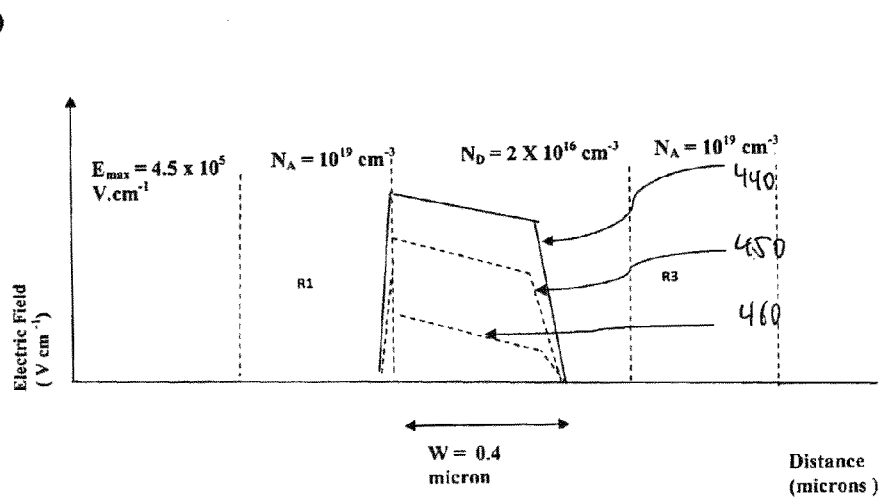

FIG. 4 is a schematic diagram showing (a) the structure of an E-MOD Si LED as device 100, the light emission zones 350 and 360, and (b), electric field profiles 440, 450 and 460 through the device for various modes of operation of the device 100. In FIG. 4 ($a$), the contacts T1, T2 and T3 are provide by respective metal feeds 410, 420 and 430.

A high bias voltage will ensure strong light emission while lower bias voltage will cause lower light emission. A complete cut-off of the light emission can be achieved when the voltage is lower than threshold voltage as necessary for light emission. This is schematically shown in FIG. 4 ($b$) indicting active light emission mode by reference numeral 440, threshold for light emission by reference numeral 450 and cut-off of light emission by reference numeral 460.

Changing the bias voltage on the third terminal T3 will change the potential profile through the structure slightly according to partial current density profiles from the second region 320 into the third region 330, and can cause variations in the light emission levels, when partial bias voltage is supplied through this terminal. Hence analogue or digital intensity/amplitude modulation can be achieved.

In other cases, carriers may be injected from the third region 330 of opposite charge carriers into the second region 320 such that variation in emitted light wavelength is achieved, hence achieving wavelength modulation of the emitted optical radiation.

Hence both amplitude and wavelength modulation can be achieved in the device by changing or modulating the E-field profile in region 2. Hence the device is therefore named a Modified E-Filed Silicon Light Emitting Device (MOD-E Si LED).

In another embodiment of the invention, the second region 320 may be sub-divided into thinner regions of lower or higher doping, so as to optimise the light emission processes or wavelength characteristics of the device 100.

In other embodiments of the invention, the doping levels as specified in the respective regions may be made opposite, in order to utilise the higher energies of excited holes for specific purposes.

In other embodiments of the invention a thin layer of secondary photon emissive material may be placed at the body 1 and body 2 interface, such that the energetic carriers penetrate or interface the layer and yield higher total photonic emission.

The light emission is generated at a zone near either zone 350 or zone 360 (or both) and may be effectively couple light into an adjacently placed waveguide structure or into an optically transparent structure. This is in the following shown in more detail, making reference to FIG. 5.

Figure 5:
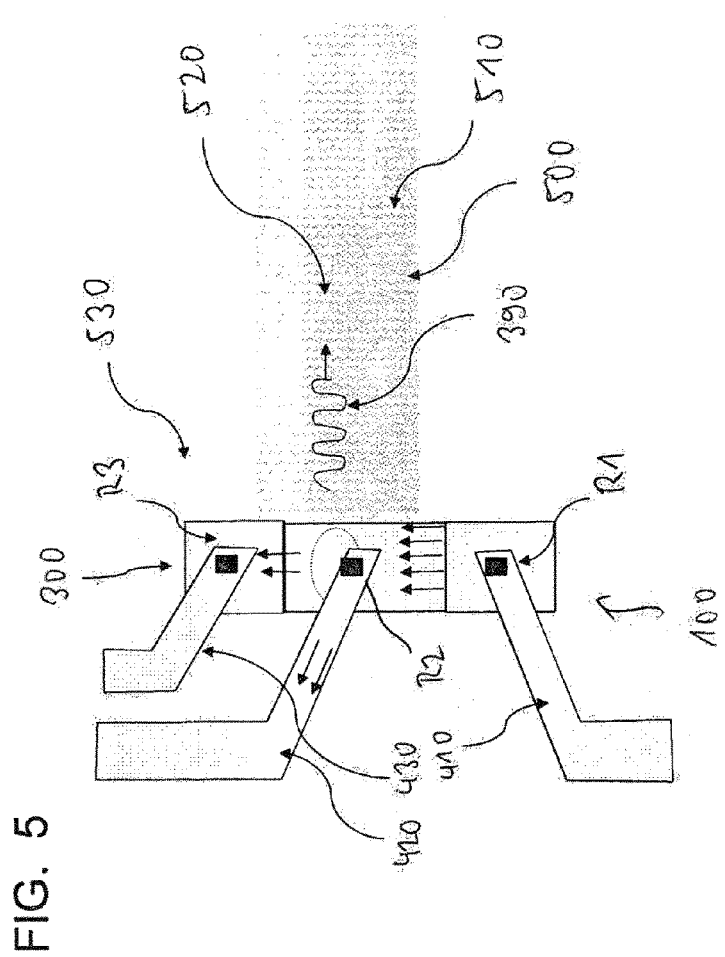
FIG. 5 is a schematic diagram showing the coupling of a E-MOD Si LED with an adjacent optically conductive body, in this case designed as an optical waveguide with higher and lower refractive index regions.

FIG. 5 is a schematic diagram showing the coupling of an E-MOD Si LED device 100 with an adjacent optically conductive body 500, in this case designed as an optical waveguide with higher refractive index regions 520 and lower refractive index regions 510. It should be noted that all components can be fabricated using conventional CMOS processing technology. For example, the contact feeds are provided on a first metal and contact layer 530.

Various types of waveguides may be utilised. Light may be coupled primarily into the CMOS over-layers through LOCOS and Si-Oxi-nitride or SiN based waveguide or optically transparent polymer structures. Alternatively the light may be coupled into Si-Oxi-nitride or SiN based waveguide trench based waveguide (OXI-TRENCH) structures, which can be primarily utilised in below 0.35 micron CMOS technologies. Particularly Oxi-nitride, silicon nitride or state of the art optically transparent polymer is suitable for the higher core material and offers very low power loss of lower than 0.1 dB in the wavelength range 700 nm to 1100 nm.

Figure 6:
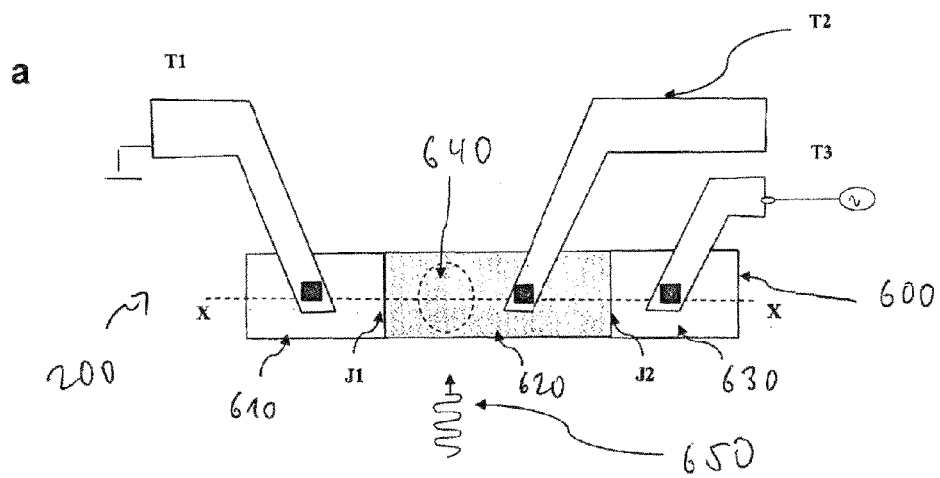
FIG. 6 is a schematic diagram showing the coupling of an E-MOD Si Detector showing (a) the structure of the device, (b), the electric field profiles through the device for various modes of operation of the device.
Figure 6:
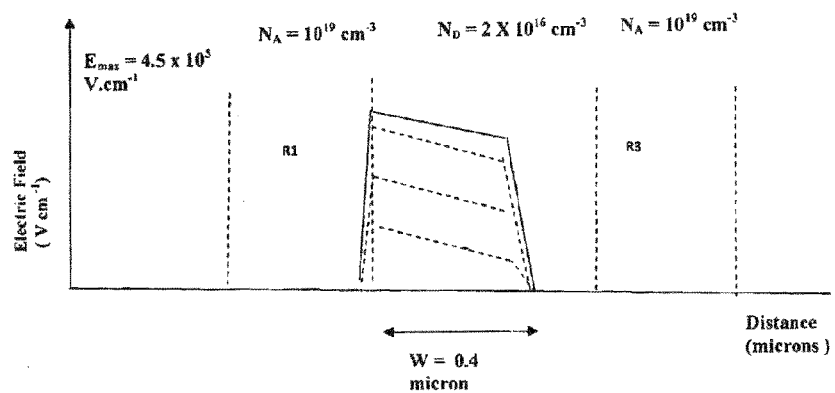

At the waveguide end, the light is effectively coupled into a detector device 200 of similar structure as the Si MOD-E Si LED, as is schematically illustrated in FIG. 6. The detector device 200 serves as the detector for the light generated by device 100 and transmitted through the optically conductive body 500.

FIG. 6 is a schematic presentation of the structure of the device in a top view. The basic active element of this system is a body 600. The body 600 is segmented in three regions, a first region 610, a second region 620 and a third region 630. The first region 610, the second region 620 and the third region 630 are arranged adjacent to each other and comprise different doping levels. The first region 610 is formed as a p+ structure, the second region 620 as an n structure and the third region 630 as either an n+ or p+ structure. Between the first region 610 and the second region 620, junction J1 is located, as indicated in FIG. 6 (a). Between the second region 620 and the third region 630, junction J2 is located. An electron-hole generating zone 640 is formed within the second region 620 by incident photons schematically indicated by reference numeral 650.

The bias voltage at terminal T2 for second region 620 is chosen that it is lower than the threshold voltage for light generation through avalanche processes. Two detection modes may be implemented depending on speed and signal-to-noise requirements. In Detection Mode 1, the junction J2 may be sufficiently high reverse biased such that secondary ionisation charge multiplication occurs during incidence of photons, yielding high signal responses at lower signal-to-noise ratios.

In Detection Mode 2, the junction J2 is biased still lower such that only electron hole pairs are generated as a result of photon incidence into the region. This will yield smaller signals, but higher speed and higher signal-to-noise ratios. The signal on the contact feed T3 on third region 630 will again be produced by dynamic carrier and voltage drop changes through the lower doped second region 620 of the device, in the region between the metal feed contact and the region 620 region 630 junction (J2) when partial bias voltage is supplied through this terminal and serves as a signal output terminal for the device. Since the device detection characteristics are also determined by the profile of the electric field of the device, it is nomenclated a MOD-E CMOS detector device 200.

The effectivity of coupling of the radiation may be optimized by dimensioning of the wave-guide structures 500, dimensioning of the Si MOD-E LED 100, and the geometrical positioning of the waveguide structure relative to the second region. In other cases, dedicated opto-coupling structures may be utilised to optimise the coupling into the waveguide structure or to transmit the radiation vertically out of the LED structure 100, or into appropriate waveguide based optical splitters.

Figure 7:
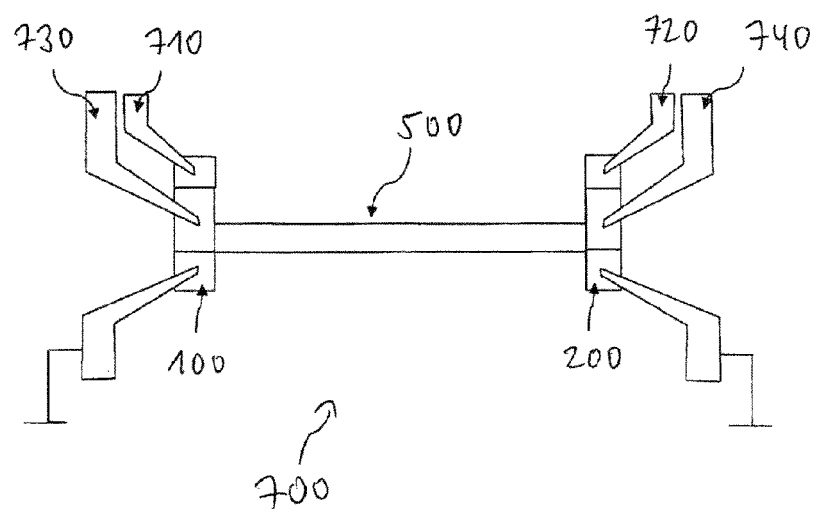
FIG. 7 is a schematic diagrams of a complete optical communication system embodiments of the invention utlising a MOD E Si CMOS LED, a CMOS based optical waveguide, and a MOD E CMOS based optical detector.
Figure 7:
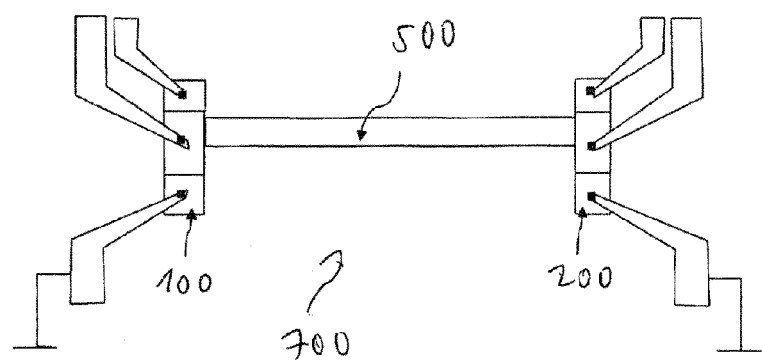

FIG. 7 is a schematic diagram of a complete optical communication system 700 utilising a MOD E Si CMOS LED 100, a CMOS based optical waveguide 500, and a MOD E CMOS based optical detector 200. The system allows for separate biasing at the input and output for different modes of operation as well as for separate signal input and output terminals. Since the input and output structures are generic and similar, devices can be set to operate either as optical source or optical receiver and vice versa, allowing for two way communication and transmission of signals and data on the same waveguide.

FIG. 7 (a) is a system optimized for optical communication with shorter wavelength 450-650 nm optical radiation.

Bias signals are provided through terminals 730 and 740, respectively. Modulation of the input signal is provided through terminal 710 and the output signal is detected though terminal 720. These are preferred embodiments in order to provide lowest operating voltages and best efficiencies. In other embodiments biasing may be provided by terminals 710 and 720, while modulation in performed by terminal 730 and signal detection is detected by terminal 740.

FIG. 7 (b) is a system optimized for longer wavelength (750 nm) optical communication based on electron relaxation processes. Here biasing is supplied through terminals 770 and 780 while modulation and signal detection is provided by 750 and 760 respectively for lowest operating voltage and highest efficiency. The detector region 640 may be biased into the charge multiplication mode as depicted by the FIG. 6 b (450) profile. In other embodiments the biasing may be supplied by terminals 750 and 760, while modulation and signal detection is supplied by terminals 770 and 780, respectively The shorter wave-lengths as generated by the Si MOD-E LED 100 from zone 350 (450-650 nm) may be utilised for short haul on chip communication purposes, or for various secondary excitation purposes using the high energy of the excited carriers. Hence a complete optical communication configuration as illustrated in FIG. 7 (*a*) or 7(*b*) may be generated.

Particularly, the longer wavelengths as generated by the Si MOD-E LED 100 will be utilised for coupling into Si Oxi-nitride based waveguides because of the low power loss per unit distance in such materials. This may generate design and construction of a complete optical communication system utilising predominantly the zone 360 emission zone. Hence a complete optical communication configuration as illustrated in FIG. 7 (*b*) may be generated.

The lateral width of the detector elements can also be optimized to partially match the absorption length of the incident radiation. For the longer wavelength detection, the utilization of ionization carrier multiplication is also more beneficial since it offers a very short lateral width for the detector elements.

Because of the specific light emission characteristics of the MOD-E Si LED 100 giving emissions particularly in the wavelength region 650-1100 nm of nW to microwatt range, it offers a very good compatibility with Silicon Oxi-nitride or Silicon nitride CMOS based waveguides of low power loss at above 700 nm, as well as the good detection characteristics of silicon p-n or p-i-n detectors at 700-850 nm, the system as described is particularly suitable for generating a optical communication system on CMOS chip. This can find diverse applications such as such as optical data transfer systems, CMOS based micro-optical-electro-mechanical structures (MOEMS), CMOS based optical inter-connect systems and CMOS based electro-optical isolators and opto-couplers.

Wavelength modulation may be obtained with slight deviations in structure and operating conditions from the generic version of the device. For wavelength modulation operation, a p+np+ configuration is preferred where region 330 In FIG. 4 (*a*) is replaced a p+ doping region at the LED source. Upon bias on T3, holes is injected from region 3 into region 2 such that enhanced interaction between relaxing energetic electrons and injected low energy holes occur, particularly stimulating photonic phonon assisted transitions of Type C in FIG. 2. Hence activating this mode of operation will induce a change from wavelength transitions from 750 nm to about 650 nm.

With slight modifications from the generic structures and concepts as described, the system may also be implemented into Silicon-On-Insulator technology as separate embodiments. Because of the similarity of the structure of the input and output devices as described in the system, a generic structure can be used at both the input and detection side of the system such that two-way communication is possible using the same channel on CMOS chip, and by only changing the bias voltages on the particular sections in order to determine the mode of operation. Two terminals are used for biasing at the input or output, while a third terminal is used for modulation and signal detection output as described earlier.

Figure 8:
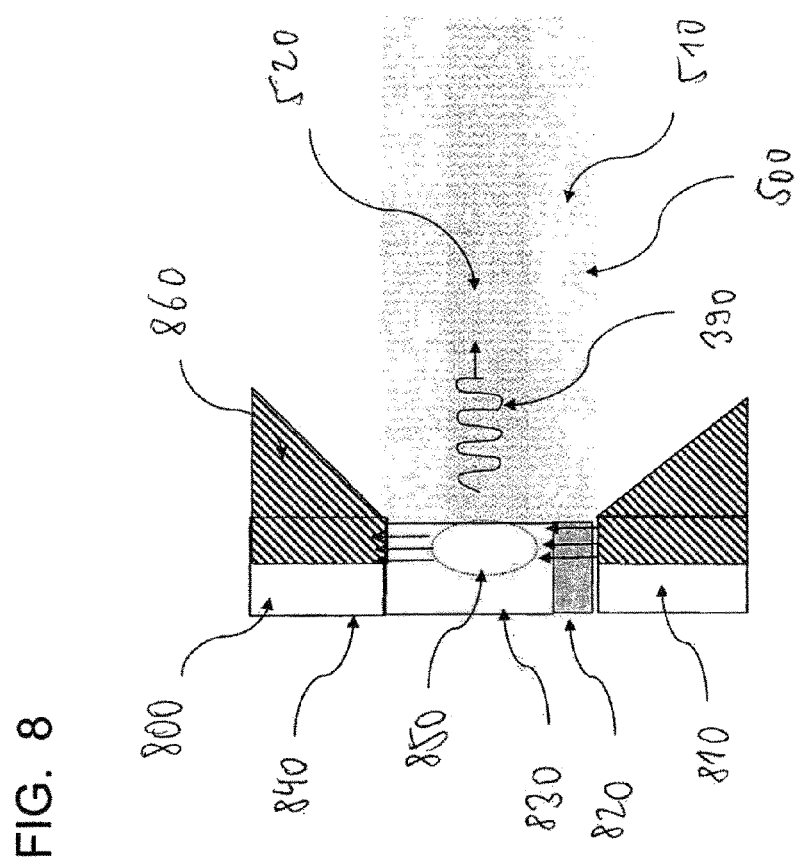
FIG. 8 shows a schematic representation of an embodiment of the generic E-MOD Si LED in order to enhance silicon and optical waveguide interface charge carrier interaction as well as enhancing optical coupling from the Si LED into a lateral positioned waveguide.

FIG. 8 shows a further embodiment of the invention in order to enhance the optical coupling from the body 300 structure into the optical conducting body 500. FIG. 8 shows a schematic representation of an embodiment of the generic E-MOD Si LED in order to enhance silicon and optical waveguide interface charge carrier interaction as well as enhancing optical coupling from the Si LED into a lateral positioned waveguide. Here the generic body 800 structure comprising three or four regions 810 to 840 are used, but the metal contacts and feeds are such placed on metal layer 860 that a higher current density is favoured at the surface of second region 820 and third region 830, hence maximizing optical yield at the region 820 and region 830 surface with the optical fibre core, hence enhancing coupling of the optical radiation 390 into the higher index core 520 of the waveguide 500.

Figure 9:
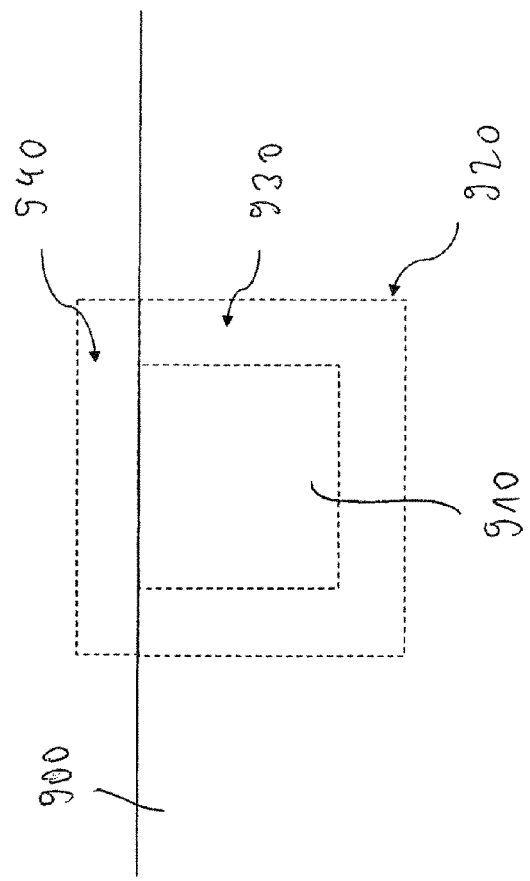
FIG. 9 shows a schematic representation of an embodiment of a silicon waveguide in CMOS technology utilising existing isolation trench technology.

FIG. 9 shows a waveguide in a cross-sectional view which may be utilised for the invention.

Light may be coupled primarily into the CMOS over-layers through LOCOS and Si-Oxi-nitride or SiN based waveguide or optically transparent polymer structures. Alternatively the light may be coupled into Si-Oxi-nitride or SiN based waveguide trench based waveguide (OXI-TRENCH) structures, which can be primarily utilised in below 0.35 micron CMOS technologies. In this case, a thin LOCOS liner of the usual isolation trenches 920 in silicon substrate 900 is made larger, followed by a suitable deposition or growth of Silicon oxi-nitride or Silicon nitride such that a higher core index 910 is formed in a lower index surrounding material 930. Finally a suitable surface layer can be deposited to encapsulate the higher index core also at the top surface.

Figure 10:
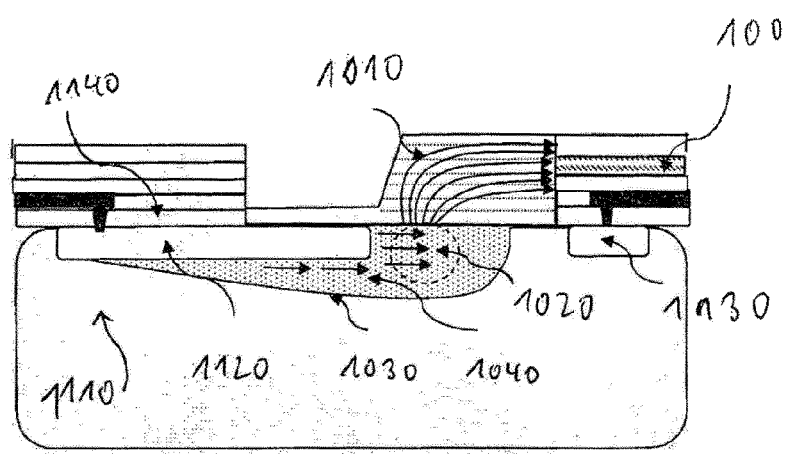
FIG. 10 shows a schematic diagram showing achievement of effective optical coupling of optical radiation from a Lateral Multiplication and Secondary Excitation Si LED, utilizing graded index optically transparent layers, into waveguide positioned in the CMOS chip over-layers.

FIG. 10 shows an embodiment for coupling of optical radiation as emitted from the Si LED 100 into a laterally positioned waveguide 1000. A window is wet-etched or dry-etched above the Si CMOS LED light emitting region 1020, having dimensions in the micron range. This is followed by appropriately masking the rest of the plan view of the CMOS chip with a mask and then depositing various layers 1010 of graded index in the cavity. If the choice of grading is chosen correct, in this case from low to high as one progress from the Si—SiO$_2$ interface towards the surface, refraction of light may be generated in two dimensions such that the emitted light is focused into the core of any single mode or multimode optical fibre, with a very good coupling coefficient.

A depletion layer 1030, a carrier excitation region 1040 are part of the Si LED 100, as well as first region 1110, second region 1120, electric contact region 1130 and oxide insulating layer 1140, similar to the devices as described with respect to the previous embodiments.

In further embodiments, different over-layers may be deposited through masks using the same graded index concepts and definition of the optical index gradient laterally in the over-layer, such that a series of optical graded index waveguides are formed in the over-layers of conventional CMOS integrated circuitry, by employing appropriate post-processing procedures.

In further embodiments different over-layers may be deposited through masks using the same graded index concepts and definition of the optical index gradient both laterally and vertically in the over-layer, such that a series of optical graded index waveguides are formed directly on top of the insulating layer, normally the field oxide layer of CMOS IC's, such that a region of higher refractive index are formed directly above the field oxide layer, and such that a conventional rib waveguide or single or multimode mode high index fibre/waveguide are formed, and such that the emission from the Si CMOS LED effectively couple into the higher index part of the waveguide. The detail process and choice of materials can be chosen in order to optimize the technology. If necessary, optical layers may be pre-deposited before metal layers are deposited which are normally require a low thermal budget and are accommodated at the end of the CMOS processing procedure. The graded index composition can also be obtained with conventional glass doping and glass flow techniques. If necessary, certain dedicated optical modules can be separately fabricated using different processes, and pick and placed into position together with pick and placing of fibre optical modules after CMOS processing, and as a post processing procedure. All these embodiments are usually suitable for implementation with above 0.35 micron CMOS technology.

Particularly, in further embodiment, a row of structures as in FIG. 8 may be utilised to form a row of electro-optical interfaces interfacing with one side surface of the chip, with the waveguide ends interfacing a row format with the side surface. This configuration is particularly viable since very good coupling of the Si LEDs is obtained into the waveguide structures. Since the waveguide emission exiting the chip side surface is each highly colluminated, very good coupling may be obtained into secondary bodies such as a row of optical fibres or other structures.

Figure 11:
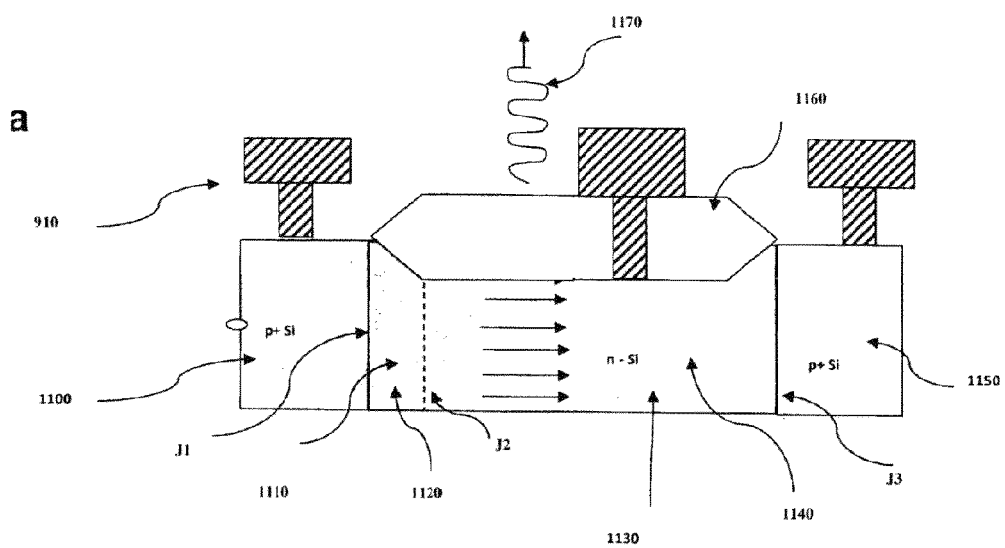
FIG. 11 shows realization of a version of the Si LED device favoring the relaxation of electrons in a low defect region, and utilising CMOS LOCOS oxidation technology and a third contact terminal facilitated through the LOCOS oxide layer.
Figure 11:
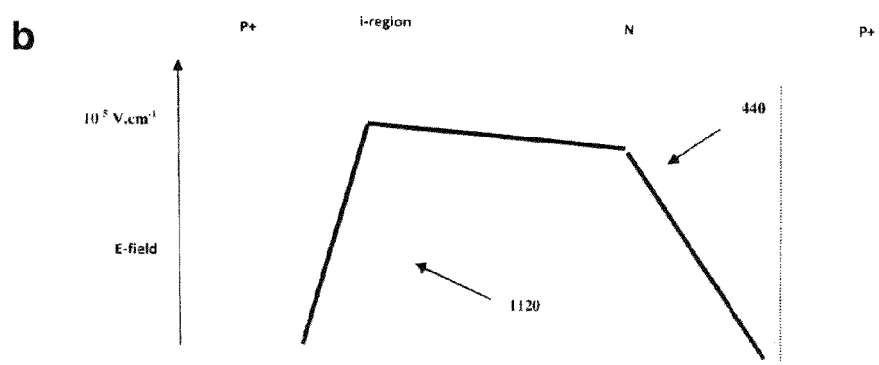

In a further embodiment, the Local Oxidation Of Semiconductor (LOCOS) may be used as in FIG. 11 to displace the light generation zone from the surface of the semiconductor, so as to optimize the coupling of light between the LED and the core of the waveguiding body. An optional i layer may be introduced between region 1 (1100) and region 2 (1130) of body 1 in order to enhance a flat E-profile and enhance carrier multiplication and carrier density.

Figure 12:
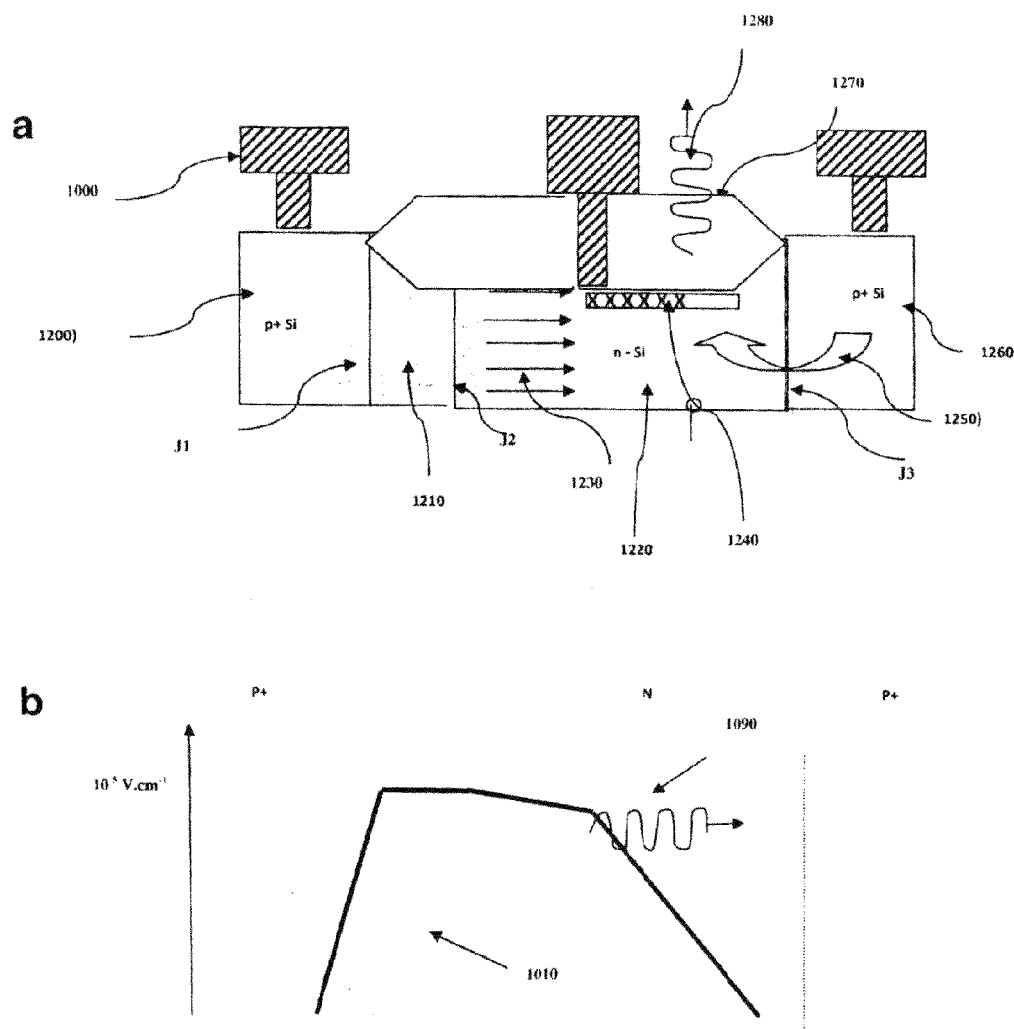
FIG. 12 shows realization of a version of the Si LED device utilizing CMOS LOCOS oxidation technology and a third contact terminal facilitated through the LOCOS oxide layer, favoring the relaxation of electrons in a low defect region with surface states present at the LOCOS—Silicon interface and injection of opposite charge carriers from the third region of the device.

In a further embodiment, the Local Oxidation Of Semiconductor (LOCOS) 1270 may be used as in FIG. 12 in order to enhance interaction with Silicon Oxide interface states with energetic or relaxing electrons.

In a further embodiment, the Local Oxidation Of Semiconductor (LOCOS) may be used as in FIG. 12 may also be used as a vehicle to introduce secondary photon emissive material 1240 either in solid or impregnated form in order to enhance the light emission from these materials when the material is penetrated by energetic carriers as generated by the above devices and various embodiments.

Figure 13:
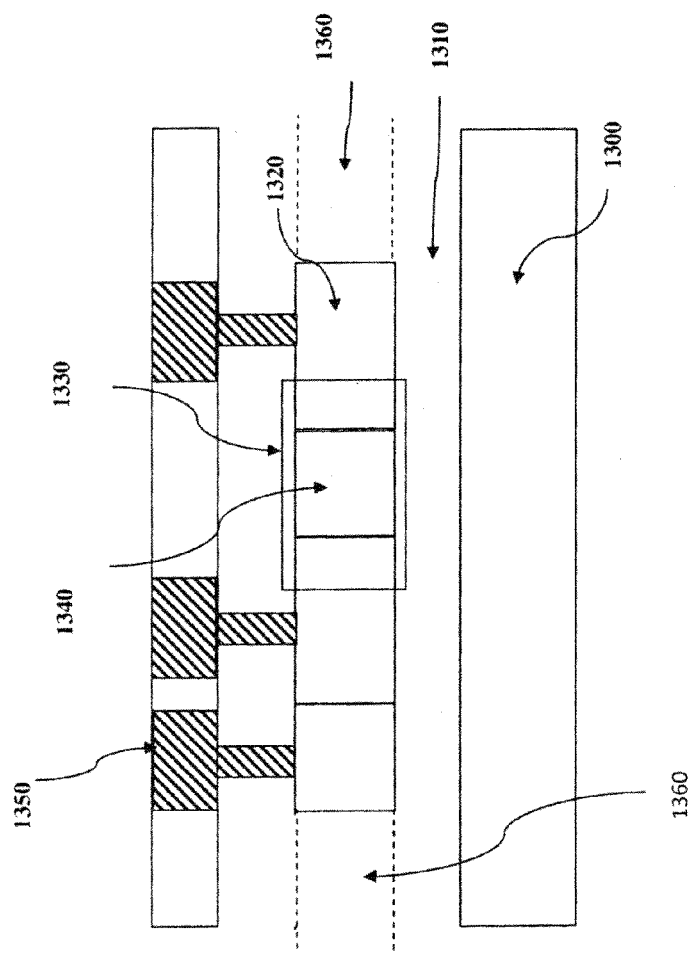
FIG. 13 shows a realization of the generic MOD E Si LED utilising Silicon-on-Insulator technology.

FIG. 13 shows an embodiment of optical coupling into waveguides utilizing Silicon-On-Insulator technology in cross-sectional view. Here the respective regions as in body 1 (1320) are defined adjacently to each other in order to create a functional Si LED structure in the Silicon active layer 1360. The silicon active layer 1360 is fabricated on the insulating layer 1350 which is again positioned on a silicon substrate. The p+nn+ active region is fabricated on the silicon layer of the three layer silicon-on oxide on Si insulator substrate. The Electrical contact regions 1350 are realized with normal plasma deposition and etching techniques. The higher core refractive index 1340 can be fabricated by special etching and secondary deposition techniques spaced laterally to the Si LED. The wave-guiding secondary optically conductive region could be fabricated by either using plasma deposition, wet oxide or secondary polymer deposition techniques, such that a strip of low refractive index is generated that contacts the active light emitting regions of the body 1 region, and lying in the plane of the silicon on insulator layer. The higher refractive index core regions can be fabricated adjacently to the body 1 structure, in the same plane as the silicon layer, by the same procedures, or using techniques and technologies as commonly utilized in the optical fibre telecommunication technology. The Electrical contact regions can be fabricated with normal plasma deposition and etching techniques. The active light emitting device can be positioned next to other active devices on the same silicon layer 1360, provided adequate electrical isolation is provided between the different electrical components.

Figure 14:
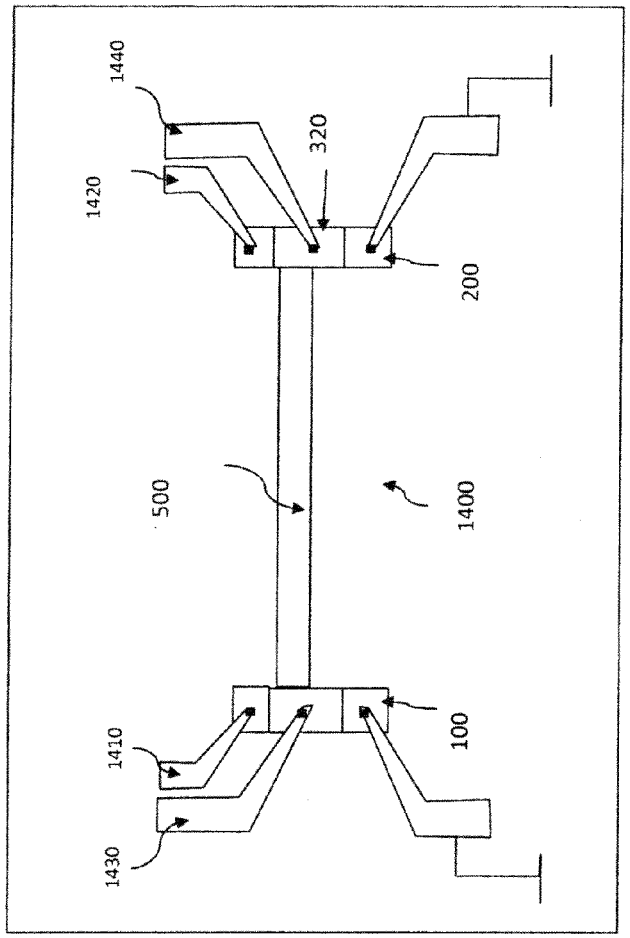
FIG. 14 is a schematic diagram of a complete optical communication system according to a further embodiment of the invention.
Figure 15:
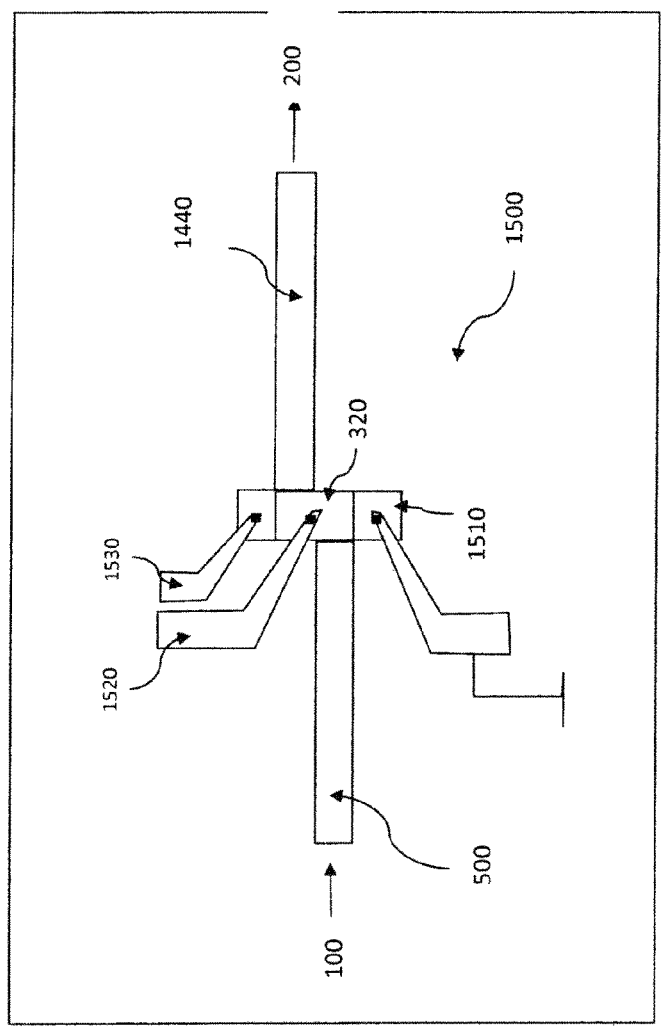
FIG. 15 is a schematic diagram of a complete optical communication system according to a further embodiment of the invention.

In further embodiments, dedicated versions of the communication systems for the longer wavelengths may be implemented in order to further improve efficiency. In specific cases the doping level may be lowered to $2 \times 10^{16}$ cm$^{-3}$ in the second region 2 of the body at both the LED 100 and the detector 200 as in FIG. 14. In this case the depletion layer may especially extend through the whole of region 2 (320) at the detector side, and optionally biased into charge multiplication mode increasing the detection efficiency of the detector at the longer wavelengths. Bias may be applied by terminals 1410 and 1420 while modulation and signal detection are applied by terminals 1430 and 1440 respectively. In some cases both modulation and bias may be applied at the same terminal 1430 in order to improve efficiency, and both biasing and signal detection may be obtained at the same terminal 1420. This configuration will especially favour effective two way communication at the longer wavelengths.

In other embodiments, dedicated one way optical communication systems may be implemented by using a $2 \times 10^{17}$ cm$^{-3}$ or $2 \times 10^{16}$ cm$^{-3}$ based LED source device 100 and a dedicated lowly doped $2 \times 10^{16}$ cm$^{-3}$ based detector at the receiving side 200. In such cases the depletion layer may extend through the region 2 (320) at the receiver side and the device optionally biased into the charge multiplication mode in order the increase the detection efficiency of the device at the longer wavelength. Bias may be applied by terminals 1410 and 1420 while modulation and signal detection are applied by terminals 1430 and 1440 respectively.

In other cases bias and modulation may be applied at the LED device on the same terminal 1430.

In other embodiments of the invention, an optional middle section 1500 may be introduced in the communication system such that transponding action occurs for the transmitted signal from a LED source 100. In the case the region 2 (320) metal terminal is biased sufficiently such that impact ionisation and secondary light emission occurs when photons at 450 to 650 nm are incident in region 2. These created secondary electrons can be transferred to the relaxation zone 360 of the device and create secondary light emission at longer wavelength of 750-850 nm according to transitions of type B and type C in FIG. 2. This secondary light emission may be then guided and transferred by waveguide 1440 or 500 to a receiver 200.

In other embodiments, the system 1500 as described above may be implemented for optical amplification purposes, whereby a weak optical signal is incident on the device as in zone 350 of region 320 in 1500, impact ionisation and secondary light emission is induced when photons are incident in region 320, and higher light emission occurs at longer wavelength in zone 360 of region 2 due to incident photons at zone 350.

In other embodiments, mixing of the two signals at 450 nm and 750 nm may be obtained in region 320, such that a longer secondary wavelength component is created at 1200 nm as a result of the mixing of the two optical signals in region 320. In still other implementations the signal of 1100 to 1200 nm as created by this method (or a forward biased pn junction) may be mixed again with a 450 nm signal to create signal components at 1550 nm. Appropriate Bragg filtering may be applied in the waveguide sections in order to achieve the necessary effects.

Although certain embodiments only have been described herein, it will be readily apparent to any person skilled in the art that other modifications and/or variations of the invention are possible. Such modifications and/or variations are therefore to be considered as falling within the spirit and scope of the invention as herein described and/or exemplified.

The invention claimed is:
1. An optical communication system comprising of a silicon based light emitting device operating by means of ava- lanche carrier multiplication and emitting at the below threshold wavelength detection range for Silicon of 850 nm;

a low loss optical waveguide operating in the below threshold wavelength detection range for Silicon of 850 nm being fabricated at the interface of a silicon and metal oxide over-layers;

and an optical detector, wherein a complete and all-silicon optical communication system is formed being capable of transferring electrical signals in terms of optical intensity variations, such intensities then being propagated through the waveguide and being detected by the optical detector; and being converted back to electrical signals, whereby the optical waveguide is formed at the interface of the silicon substrate and the silicon over-layers by using a combination of shallow and deep trench realizations and depositing silicon oxide and silicon nitride or any other suitable refractive materials into the trench regions.

2. The optical communication system as claimed in claim 1, wherein the Silicon Light emitting device comprises a first body having a first region of high doping interfacing with a second region of lower doping and then interfacing with a third region of higher doping, such that transfer of carriers occurs from the first to the third region, wherein the first body is embedded into the second body such that a thin fourth region of very low doping level is introduced between the first and second region, so as to enhance the electric field profile between the first and second body and so as to enhance light emission from the device.

3. The optical communication system as claimed in claim 2, wherein the Silicon Light emitting device further comprises a third electrical metal terminal electrically contacting the second region such that the electric field profile in the lower doped second region is modified, so as extract or inject additional carriers into or from the second region, and so as to enhance the light emission from the device.

4. The optical communication system as claimed in claim 2, wherein first body interfaces with a second body such that effective transfer of optical radiation occurs from the first to the second body.

5. The optical communication system as claimed in claim 4, wherein the second body is the optical waveguide comprises an optical fibre or comprises an environment outside the system.

6. The optical communication system as claimed claim 1, wherein the light emitting device comprises a first body having a first region of high doping interfacing with a second region of lower doping and then interfacing with a region of higher doping, such that transfer of carriers occurs from the first to the third region.

7. The optical communication system as claimed claim 6, wherein an additional third electrical metal terminal is electrically contacting the second region such that the electric field profile in the lower doped second region is modified, so as to cause enhanced recombination of excited carriers with a high density of defect states as introduced into the second region or a region bounding the second region.

8. The optical communication system as claimed claim 1, wherein the light emitting device comprises a first body having a first region of high doping interfacing with a second region of lower doping and then interfacing with a region of higher doping, such that transfer of carriers occurs from the first to a third region so as extract or inject additional carriers into or from the second region, and so as to enhance the light emission from the device, so as to cause excited carriers to interact with a secondary material bounding or interfacing with the second region, or impregnated into the second region such that secondary photonic emission processes occur as a result of the interaction of the energetic carriers with the secondary material.

9. The optical communication system as claimed claim 8, wherein the first body interfaces with a second body such that effective transfer of optical radiation occurs from the first to the second body.

10. The optical communication system as claimed claim 9, wherein the first body being embedded into the second body such that the electric field profile along the boundary of the first body being modified and enhanced multiplication of excited carriers occurs and such that enhanced light emission occurs from the device.

11. The optical communication system as claimed in claim 1, wherein the light emitting device comprises a first body having a first region of high doping interfacing with a second region of lower doping and then interfacing with a third region of higher doping, such that a p+nn+ structure or a p+np+ structure is formed.

12. The optical communication system as claimed in claim 1, comprising a middle section such that transponding action occurs for the transmitted signal from the LED source.

13. The optical communication system as claimed in claim 1, whereby a weak optical signal is incident on the device, impact ionisation and secondary light emission is induced when photons are incident in the second region, and higher light emission occurs at longer wavelength such that optical amplification occurs.

14. The optical communication system as claimed in claim 1, wherein the waveguide is formed by defining a thin layer of low refractive index at the sides of the trench and a body of higher refractive index material are embedded in the body of lower refractive index material at the trench sidewalls.

15. The optical communication system as claimed in claim 1, whereby the optical waveguide is formed using silicon on insulator (SOI) technology with the four terminal light emitting device operating in the avalanche operating mode is fabricated on the silicon over-layer plane and the waveguide is realized adjacently to the device by using a series of etching and secondary deposition techniques of silicon oxide and silicon-nitride, and such that the waveguide is both at the top and bottom and sides are surrounded by silicon oxide material or any other material with refractive index lower than the core of the waveguide.

* * * * *